(12) United States Patent
Kanekawa et al.

(10) Patent No.: US 7,233,534 B2
(45) Date of Patent: Jun. 19, 2007

(54) ELECTRONIC CIRCUIT PACKAGE

(75) Inventors: Nobuyasu Kanekawa, Los Angeles, CA (US); Hirokazu Ihara, Machida (JP); Masatsugu Akiyama, Yokohama (JP); Kiyoshi Kawabata, Abiko (JP); Hisayoshi Yamanaka, Hitachi (JP); Tetsuya Okishima, Katsuta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/180,733

(22) Filed: Jul. 14, 2005

(65) Prior Publication Data

US 2005/0248017 A1 Nov. 10, 2005

Related U.S. Application Data

(63) Continuation of application No. 10/786,008, filed on Feb. 26, 2004, now Pat. No. 7,120,069, which is a continuation of application No. 10/370,518, filed on Feb. 24, 2003, now Pat. No. 6,728,904, which is a continuation of application No. 09/793,968, filed on Feb. 28, 2001, now Pat. No. 6,584,004, which is a continuation of application No. 09/271,448, filed on Mar. 18, 1999, now Pat. No. 6,223,273, which is a continuation of application No. 09/095,049, filed on Jun. 10, 1998, now Pat. No. 6,195,742, which is a continuation of application No. 08/746,942, filed on Nov. 18, 1996, now Pat. No. 5,789,805, which is a continuation of application No. 08/523,346, filed on Sep. 5, 1995, now Pat. No. 5,614,761, which is a continuation of application No. 07/843,234, filed on Feb. 28, 1992, now Pat. No. 5,468,992.

(30) Foreign Application Priority Data

Feb. 28, 1991 (JP) ................................ 3-034038

(51) Int. Cl.
*G11C 7/00* (2006.01)
(52) U.S. Cl. ........................ 365/200; 257/778; 257/724
(58) Field of Classification Search ................ 365/200; 257/778, 724
See application file for complete search history.

(56) References Cited

U.S. PATENT DOCUMENTS

| 4,144,561 A | 3/1979 | Tu et al. |
| 4,172,282 A | 10/1979 | Aichelmann, Jr. et al. ...................... 364/246.92 |
| 4,432,055 A | 2/1984 | Salas et al. ............ 364/DIG. 1 |
| 4,441,075 A | 4/1984 | McMahon |

(Continued)

FOREIGN PATENT DOCUMENTS

JP 1258466 10/1989

(Continued)

OTHER PUBLICATIONS

Data Book "Hitachi IC Memory Data Book", Hitachi HB56A49 Series, 4194304—word x9-bit High Density Dynamic RAM Module, pp. 1-8 (English Translation).

(Continued)

*Primary Examiner*—Viet Q. Nguyen
(74) *Attorney, Agent, or Firm*—Mattingly, Stanger, Malur & Brundidge, P.C.

(57) ABSTRACT

An electronic apparatus which includes a wiring substrate which includes wiring conductors, and a plurality of semiconductor bare chips that are formed on the wiring substrate. The semiconductor bare chips include a processor for processing data and a circuit having a checking function for detecting faults of the processor.

6 Claims, 7 Drawing Sheets

U.S. PATENT DOCUMENTS

| | | | |
|---|---|---|---|
| 4,441,164 A | 4/1984 | Pavan et al. | |
| 4,577,293 A | 3/1986 | Matick et al. | 365/189.04 |
| 4,602,271 A | 7/1986 | Dougherty, Jr. et al. | |
| 4,631,686 A * | 12/1986 | Ikawa et al. | 716/12 |
| 4,649,474 A | 3/1987 | Ambrosius, III et al. | |
| 4,689,658 A | 8/1987 | Akasaki et al. | |
| 4,722,130 A | 2/1988 | Kimura et al. | |
| 4,746,966 A | 5/1988 | Fitzgerald et al. | |
| 4,752,927 A | 6/1988 | Melling, Jr. | 714/3 |
| 4,773,044 A | 9/1988 | Sfarti et al. | 711/211 |
| 4,783,695 A | 11/1988 | Eichelberger et al. | |
| 4,803,682 A | 2/1989 | Hara et al. | 714/23 |
| 4,807,284 A | 2/1989 | Kleijne | |
| 4,811,288 A | 3/1989 | Kleijne et al. | |
| 4,907,062 A | 3/1990 | Fukushima | |
| 4,918,811 A | 4/1990 | Eichelberger et al. | |
| 4,922,363 A | 5/1990 | Long et al. | 361/3 |
| 4,933,898 A | 6/1990 | Gilberg et al. | |
| 4,979,289 A | 12/1990 | Dunaway et al. | |
| 4,993,148 A | 2/1991 | Adachi et al. | |
| 5,016,087 A | 5/1991 | Haug et al. | |
| 5,017,993 A | 5/1991 | Shibata | |
| 5,019,943 A | 5/1991 | Fassbender et al. | |
| 5,028,986 A | 7/1991 | Sugano et al. | |
| 5,050,039 A | 9/1991 | Edjors | |
| 5,068,850 A | 11/1991 | Moore | 370/449 |
| 5,072,283 A | 12/1991 | Bolger | |
| 5,081,563 A | 1/1992 | Feng et al. | |
| 5,128,737 A * | 7/1992 | van der Have | 257/503 |
| 5,149,940 A | 9/1992 | Davis et al. | 219/130.21 |
| 5,173,844 A | 12/1992 | Adachi et al. | |
| 5,182,632 A | 1/1993 | Bechtel et al. | |
| 5,185,717 A | 2/1993 | Mori | |
| 5,200,810 A | 4/1993 | Wojnarowski et al. | |
| 5,237,203 A | 8/1993 | Massaron | |
| 5,241,456 A | 8/1993 | Marcinkiewicz et al. | |
| 5,243,208 A | 9/1993 | Isomura et al. | |
| 5,285,107 A | 2/1994 | Kazami et al. | |
| 5,325,265 A | 6/1994 | Turlik et al. | |
| 5,371,390 A * | 12/1994 | Mohsen | 257/209 |
| 5,391,917 A | 2/1995 | Gilmour et al. | |
| 5,468,992 A | 11/1995 | Kanekawa et al. | 257/676 |
| 5,576,554 A | 11/1996 | Hsu | 257/48 |
| 5,594,890 A * | 1/1997 | Yamaura et al. | 703/23 |
| 5,614,761 A | 3/1997 | Kanekawa et al. | |
| 5,677,569 A | 10/1997 | Choi et al. | |
| 5,768,613 A * | 6/1998 | Asghar | 712/35 |
| 5,789,805 A | 8/1998 | Kanekawa et al. | |
| 6,195,742 B1 | 2/2001 | Kanekawa et al. | 712/33 |
| 6,223,273 B1 | 4/2001 | Kanekawa et al. | 712/33 |
| 6,324,114 B1 | 11/2001 | Hineno | 365/230.03 |
| 6,376,917 B1 | 4/2002 | Takeshita et al. | 257/778 |
| 6,584,004 B2 | 6/2003 | Kanekawa et al. | |
| 6,728,904 B2 | 4/2004 | Kanekawa et al. | 714/31 |
| 2001/0022739 A1 | 9/2001 | Funaba et al. | 365/63 |
| 2001/0024389 A1 | 9/2001 | Funaba et al. | 365/200 |
| 2001/0033013 A1 | 10/2001 | Lee | 257/679 |
| 2002/0040261 A1 | 4/2002 | Nakamoto et al. | 701/1 |
| 2002/0056911 A1 | 5/2002 | Iwaya et al. | 257/738 |
| 2003/0131228 A1 | 7/2003 | Tworney | 713/153 |

FOREIGN PATENT DOCUMENTS

| | | |
|---|---|---|
| JP | 481471970 | 6/1996 |

OTHER PUBLICATIONS

Data Book "Hitachi IC Memory Data Book", Hitachi, HB56D51236 Series 524288-word × 36-bit High Density Dynamic RAM Module, pp. 1-10 (English Translation).

Synchronous Dram Module; Advance 64 MEG &72 Registered SDRAM DIMM; pp. 1-17.

19404—word×9—bit High Density Dynamic RAM Module; pp. 849-857.

* cited by examiner

ELECTRONIC CIRCUIT PACKAGE

CROSS REFERENCE TO RELATED APPLICATIONS

The present application is a continuation of application Ser. No. 10/786,008, filed Feb. 26, 2004 now U.S. Pat. No. 7,120,069; which is a continuation of application Ser. No. 10/370,518, filed Feb. 24, 2003, now U.S. Pat. No. 6,728, 904; which is a continuation of application Ser. No. 09/793, 968, filed Feb. 28, 2001, now U.S. Pat. No. 6,584,004; which is a continuation of application Ser. No. 09/271,448, filed Mar. 18, 1999, now U.S. Pat. No. 6,223,273; which is a continuation of application Ser. No. 09/095,049, filed Jun. 10, 1998, now U.S. Pat. No. 6,195,742; which is a continuation of application Ser. No. 08/746,942, filed Nov. 18, 1996, now U.S. Pat. No. 5,789,805; which is a continuation of application Ser. No. 08/523,346, filed Sep. 5, 1995, now U.S. Pat. No. 5,614,761; which is a continuation of application Ser. No. 07/843,234, filed Feb. 28, 1992, now U.S. Pat. No. 5,468,992, the contents of which are incorporated herein by reference.

BACKGROUND OF THE INVENTION

The present invention relates to the miniaturization of an electronic circuit package and more particularly to an extra-small computer for use in space exploration.

A number of computers are being employed for various uses, and there is an increased demand for smaller and lighter computers. Computers for use in space are required to be particularly smaller and lighter than conventional computers in order to decrease launching costs while increasing the payload.

As shown by a photograph 1 of "Development of LSI for Radiation Resistant 16-Bit Microprocessor", pp. 410–411, Goke et al. Collection of Papers at 32nd Space Science and Technology Federation Lecture Meeting, a space computer is built of, for instance, discrete parts with reliable, resistant-to-environment single chips contained in one package.

There has been no serious consideration given to decreasing the size and weight in the computer as the computer comprised discrete parts.

On the other hand, a so-called multiple chip mounting technique, that is, the technique of mounting a plurality of bare chips on one wiring substrate for use on the ground, is being studied. It has heretofore been arranged that, as shown in FIG. 3 of "Nikkei Micro Device", pp. 32–40, December Issue, 1989, a wiring conductor to be connected to a bonding pad is led out of the bonding page.

It was not considered, however, to make wiring density uniform in this technique. The wiring density around the die bonding pad in particular is made extremely high and consequently effective wiring cannot be implemented. The wiring density in the outermost layer thus causes a bottleneck and the package size is not sufficiently reduced. As the via hole connecting the upper and lower layers occupied most of the area on the particular multilayer wiring substrate, the via holes account for a large percentage of area on the outermost layer, particularly around the die bonding pad.

With respect to a fault tolerant system, a checking unit for detecting errors and faults and a unit under check are accommodated in one and the same chip to reduce the size as described in "Trial Manufacture and Evaluation of Fault Tolerant Quartz Oscillation IC", by Tsuchimura et al., Research Material, 24th FTC Study Meeting. With the diffusion of ASICs (Application specified ICs" is particular, attempts have been made to add an MPU inspection circuit by making an ordinary MPU a core through the ASIC technology.

Faults and trouble affecting the whole chip were not taken into consideration in this technique described above. When the checking unit and the unit under check develop trouble simultaneously, the irregularity might not be detected.

SUMMARY OF THE INVENTION

An object of the present invention is to provide a small and light electronic apparatus, in particular an electronic circuit package, with high reliability.

Another object of the present invention is to provide a small and light electronic apparatus in which the number of pins affixed to the outside of the package is reduced to prevent an increase of the package size.

Further still, yet another object of the present invention is to provide a small and light electronic apparatus in which the concentration of the wiring density is eased to prevent the increase of the package size.

According to the present invention, all semiconductor chips to be substantially connected by means of a bus line are bare chip packaged on a wiring substrate, and the semiconductor chips and the wiring substrate are connected by wiring bonding between wire bonding pads formed on the semiconductor chips and the wiring substrate. The wiring substrate may be a multilayered substrate.

Preferably, there is an insulating layer partially formed on the surface of the multilayer wiring substrate and a die bonding ground formed on the surface of the insulating layer, in order to use a portion of the multilayer wiring substrate under the die bonding ground as a wiring or a via hole region, and at least one of the semiconductor chips is formed on the die bonding ground. In a preferred embodiment of the present invention, there are wiring conductors from the wiring pads and via holes formed in the periphery and inside of the die bonding ground, and the wiring conductors are connected to other wiring conductors of a different wiring layer in the multilayer wiring substrate through the via hole.

Preferably, the bus line includes two data bus lines. The semiconductor chips connected with one data bus line are formed on one side of the wiring substrate and the semiconductor chips connected with the other data bus line are formed on the other side of the wiring substrate.

Preferably, the semiconductor chips include a checking unit and a unit under check.

Electronic apparatuses such as computers include a plurality of semiconductor chips that are normally connected to a bus having a number of signal lines. With discrete parts constituting the apparatus conventionally, an enormous number of pins are required as the signal lines connected to the bus are used to couple the internal and external devices of a package. In the present invention, as all of the semiconductor chips connected to the bus are formed into a single package, the number of signal lines connecting the inside and outside of the package is drastically reduced. In other words, the number of pins connecting the signal lines inside and outside of the wiring substrate decreases. As a result, the electric apparatus become small and light in comparison to conventional apparatuses.

Moreover, as each semiconductor chip is subjected to bare chips packaging, a fault of one chip does not influence other chips.

As lead-out lines can be formed from wiring bonding pads and via holes even under the die bonding ground, according to the present invention, the wiring density in the neighborhood of the wire bonding pads is prevented from centering there around. Therefore, the wiring density in each wiring layer is uniformized to the extent that they are effectively utilizable. As a result, the package becomes small.

The data line connected to MPU (Microprocessing Unit) ranges from 4, 8, 16, 32 up to 64 bits in width, for instance, depending on the kind of 141W. On the other hand, the data line connected to ROM (Read Only Memory) and RAM (Random Access Memory) ranges from 1, 4 up to 8 bits in width, for instance, depending on the kind of data line to be connected to the storage element. In other words, the data width of the storage element in this case is narrower than that of the MPU in many cases. Therefore, according to a preferred embodiment of the present invention, the data lines are grouped according to the width to be connected to the storage element and the storage element to be connected to the data line belonging to the same group is packaged on the same surface of the wiring substrate. As a result, the number of wiring layer-to-layer connections (via holes) is reduced and the wiring substrate is minimized in size as the area occupied by the via hole is decreased.

Although the semiconductor element often causes transistor (gate)-based trouble in many cases, the trouble may involve the whole element (chip). In the case of the trouble involving the whole chip, the electronic apparatus comprising the checking unit and the unit under check is unable to detect the trouble, thus making the addition of the checking unit meaningless.

Even when the checking unit and the unit under check are constructed of different packages, it will be essential for the checking signal lines to be provided between the checking signal lines. This will increase the size of the electronic apparatus.

Consequently, the checking unit and the unit under check are separately provided in respective chips on the same wiring substrate on a bare chip basis. The wiring substrate and the bare chips are connected by wire bonding into a single package. The omission of a fault involving the whole chip is thus prevented and furthermore, a small, light-weight electronic apparatus can be made available.

BRIEF DESCRIPTION OF THE DRAWINGS

These and other objects, features and advantages of the present invention will be understood more clearly from the following detailed description with reference to the accompanying drawings, wherein.

DESCRIPTION OF THE PREFERRED EMBODIMENT

Figure 1:
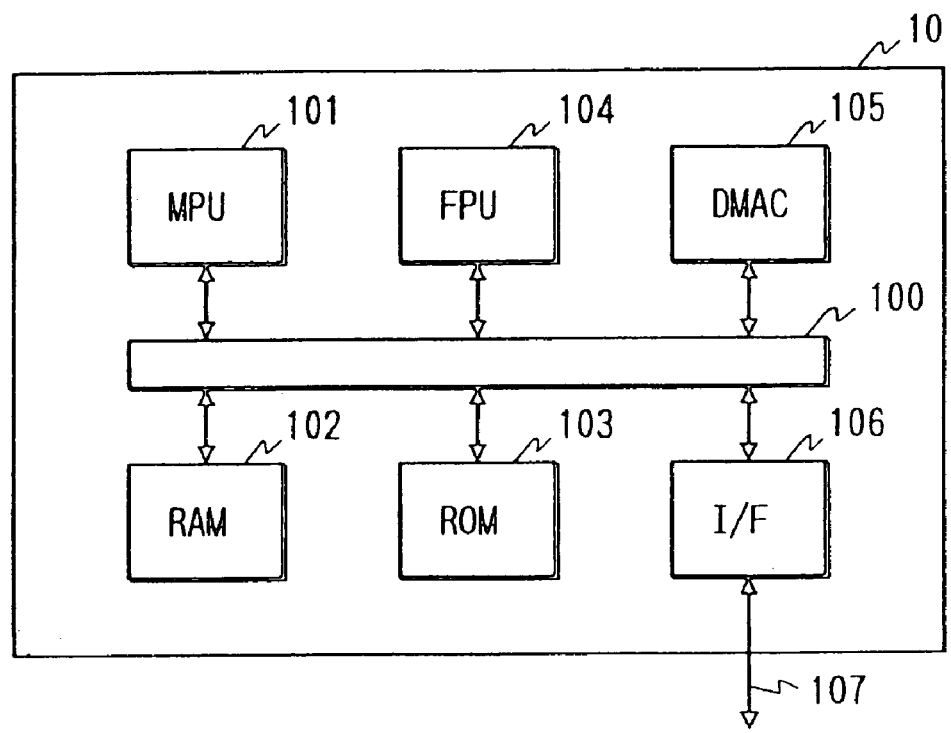
FIG. 1 is an overall structural view of an embodiment of the present invention.

FIG. 1 illustrates the inner construction of an electronic apparatus embodying the present invention by way of example. In the embodiment shown, MPU 101, RAM 102, ROM 103, FPU (Floating-point Processing Unit) 104, DMAC (Direct Memory Access controller) 105, and interface circuit 106 are connected via bus 100 in a wiring substrate 10. What is particularly noticeable according to this embodiment is that the bus 100 does not lead out of the wiring substrate 10, but only an interface line 107 which interfaces with external devices leads out of the wiring substrate 10.

All semiconductor chips to be connected to the bus 100 are totally packaged on the wiring substrate 10 according to this embodiment. Since the bus 100 does not led out of the wiring substrate 10, the number of signal lines connecting between internal and external devices is reduced by a large margin over the prior art. Accordingly, the number of pins connecting between the signal lines inside and outside the wiring substrate 10 decreases and this overcomes an obstacle to rendering the wiring substrate smaller and lighter.

Figure 2:
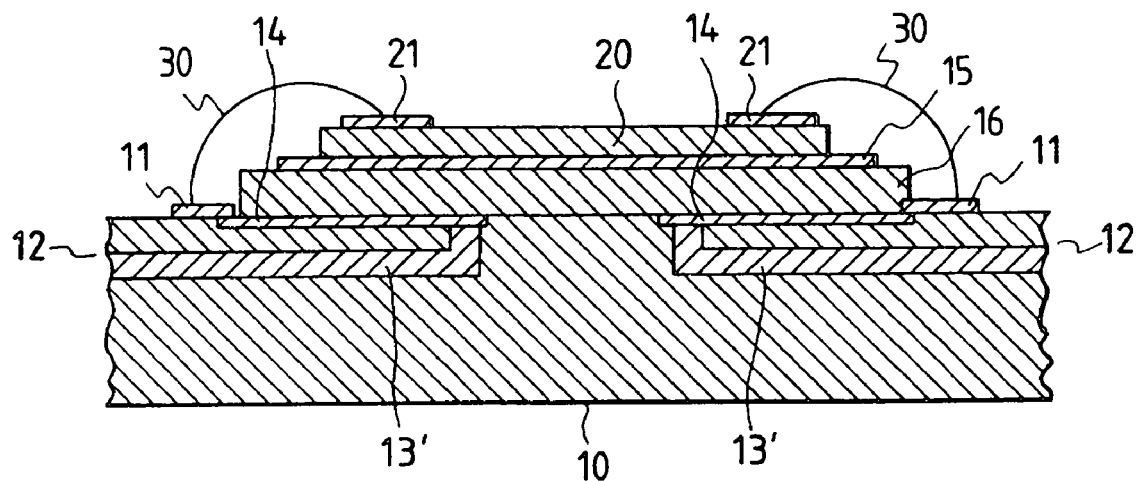
FIG. 2 is a sectional view of the die bonding portion of a wiring substrate according to the present invention.
Figure 3:
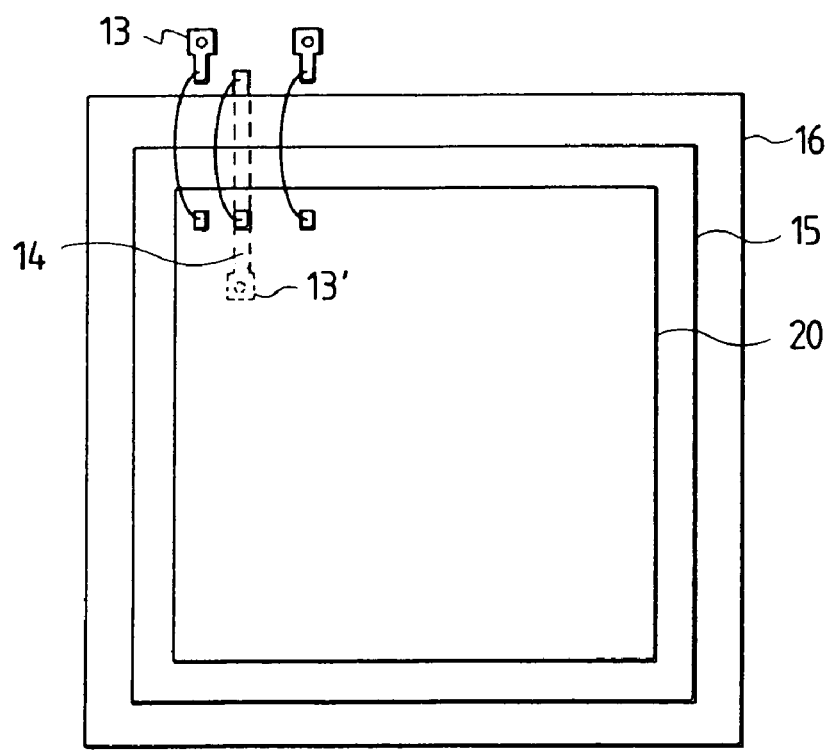
FIG. 3 is a diagram showing an arrangement of via holes in an embodiment of the present invention.

FIG. 2 is a sectional view of a die bonding portion of the wiring substrate according to the present invention. Wire bonding pads 11 are formed on the wiring substrate 10 and an insulating layer 16 is formed on a wiring conductor 14 for use in leading out of the wire bonding pad. A die bonding ground 15 is formed on the insulating layer 16 and a semiconductor chip 20 is bonded thereto by die bonding. A bonding wire 30 is then used for connecting a wire bonding pad 21 on the semiconductor chip 20 and the wire bonding pad 11 on the wiring substrate 10. According to this embodiment, as shown in FIG. 3, via holes 13, 13' may be formed in the periphery and inside of the die bonding ground 15, respectively. Via hole 13 formed in the periphery of said die bonding ground 15 and said wire hole 13' formed inside of said die bonding ground 15 are preferably arranged alternately. As a result, a portion beneath the die bonding ground 15 as the outermost layer that has heretofore not been utilized may be put to practical use as a wiring and a via hole region. An area to be occupied by wiring and via hole regions can thus be made drastically smaller than what is occupied by the semiconductor chip of the wiring substrate.

Figure 4:
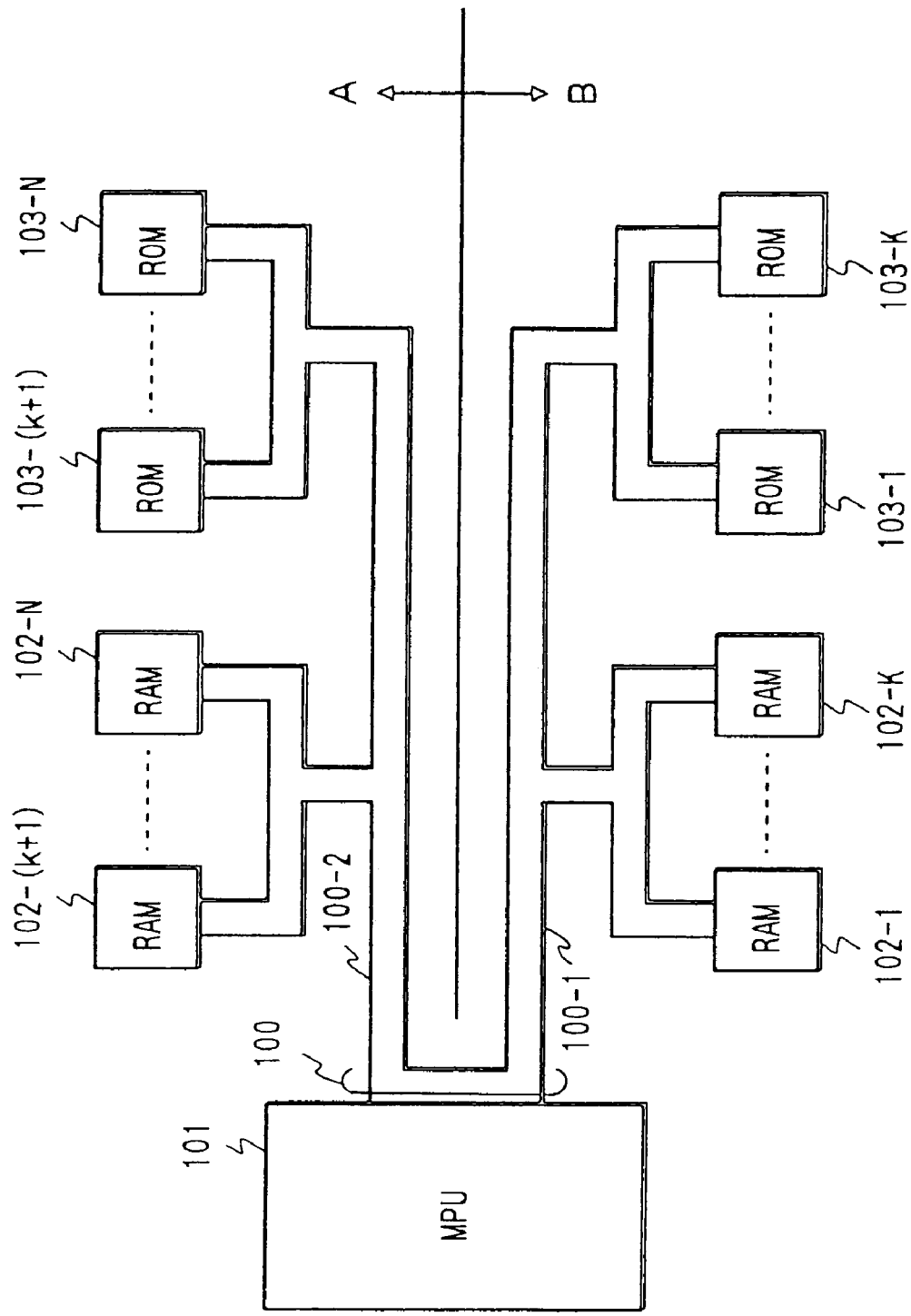
FIG. 4 is a diagram showing a division of a data bus in an embodiment of the present invention.

FIG. 4 refers to an embodiment wherein signal lines of the data bus 100 connected to MPU 101 are divided into two groups 100-1 and 100-2.

RAMs 102-1–102-k and ROMs 103-1–103-k connected to the data bus 100-1 are packaged on one side (B side) of the substrate, whereas RAMS 102-(k+1)–102-N, ROMs 103-(k+1)–103-N connected to the data bus 100-2 are packaged on the other side (A side) of the substrate, wherein k and N are integers. According to this embodiment, it is unnecessary to connect the data bus on the A side to what is on the B side and hence the number of via holes in a wide area is significantly reduced. As a result, an area to be occupied by wiring and via hole regions can thus be made drastically smaller than what is occupied by the semiconductor chip of the wiring substrate, so that the electronic apparatus can be made smaller and lighter.

Figure 5:
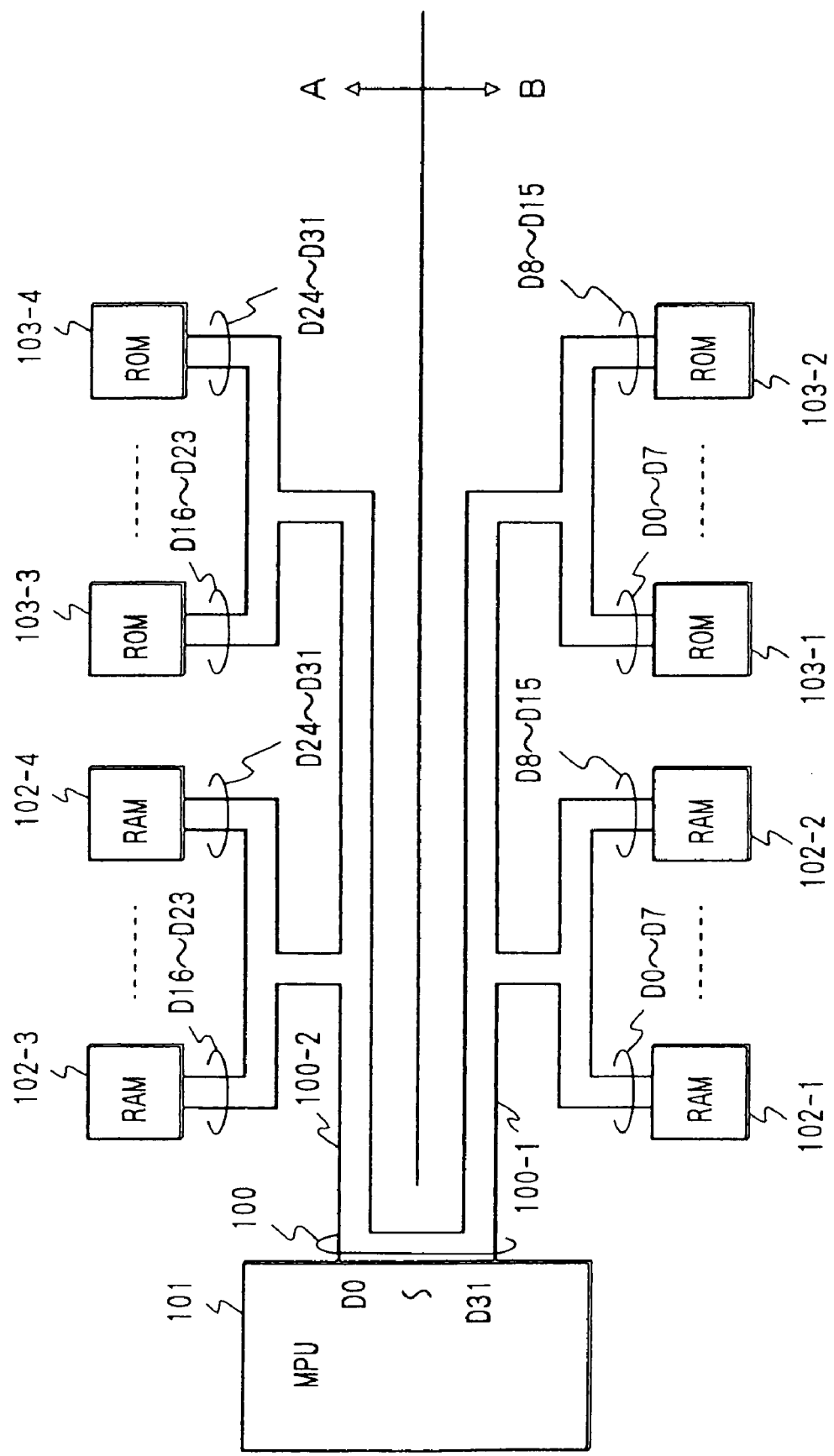
FIG. 5 is a diagram showing a division of a data bus having 32 bits width in an embodiment of the present invention.

FIG. 5 refers to an embodiment, wherein the data bus 100 connected to the MPU 101 is 32 bits wide and the data bus connected to ROM and RAM is 8 bits wide. Among data lines DO–D31 constituting the data bus 100, DO–D15 are formed into a group of data bus 100-1, and D16–D31 into a group of data bus 100-2. DO–D7 in the group of data bus 100-1 are connected to RAM 102-1 and ROM 103-1, and D8–D15 to RAM 102-2 and ROM 103-2. Moreover, D15–D23 in the group of data bus 100-2 are connected to RAM 102-3 and ROM 103-3, and D24–D31 to RAM 102-4 and ROM 103-4. According to this embodiment, the electronic apparatus can be made smaller and lighter as in the case of the embodiment shown in FIG. 4.

According to the embodiments shown in FIGS. 2 to 5, it is also possible to package as many bare chips as possible on the wiring substrate limited in size.

Figure 6:
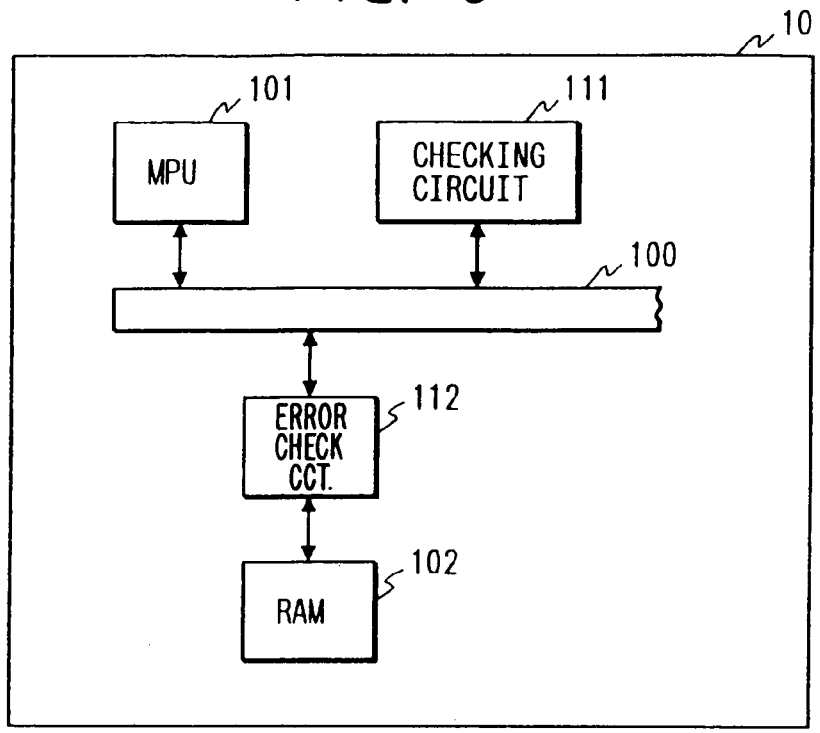
FIG. 6 is a structural view of an MPU with checking circuit and an RAM with an error correction code on a wiring substrate in an embodiment of the present invention.

FIG. 6 refers to an embodiment wherein MPU 101, a checking circuit 111 of the MPU 101, and RAM 102, an error correction code encoding/decoding circuit 112 are packaged in the form of bare chips on the wiring substrate 10. In this case, a bonding wire has been omitted for simplification.

MPU 101 and the checking circuit 111 are different bare chips and connected by wire binding on the wiring substrate 10. Heretofore, various systems have been proposed as the checking circuit 111. There are the following, for instance:

(1) A watch dog timer for resetting MPU 101 after sensing its operation on impulse when it is inaccessible within a fixed period of time.

(2) A system having a reference MPU (not shown) within the checking circuit 11 and while comparing the output signal of the reference MPU with that of MPU 101, regards the reference MPU or MPU 101 as irregular once nonconformity is found and so on.

In the conventional method of packaging MPU 101 and the checking circuit 111 separately, the number of packages, the number of wires and dimensions of the electronic apparatus tend to increase. In the method recently followed for forming the MPU 101 and the checking circuit 111 on the same chip, moreover, a fault involving the whole chip is not completely detectable as even the checking circuit 111 ceases to function.

According to this embodiment, MPU 101, with the checking circuit 111 capable of detecting a fault involving the whole chip, is provided without causing the number of packages and that of wire to increase. Therefore, a small lightweight, reliable electronic apparatus can be provided.

RAM 102 and the error correction code encoding/decoding circuit 112 are different bare chips and connected by wire bonding on the wiring substrate 10.

The error correction code adds an error detection/correction redundant bit to the data stored in the memory, thus causing an error to be detected and corrected by making a code-to-code Hamming distance 4 or greater. When the code-to-code Hamming distance is set to 4, 1-bit error correction is possible, but a 2-bit error remains only detectable. Consequently, it is called SECDED (Single-Error-Correction, Double-Error Detection). For instance, a 6-bit detection/correction redundant bit needs adding when SECDED is meant to be realized concerning 16-bit data. A detailed description of an error correction code will be omitted since the present invention is not aimed to provide the error correction code.

In the conventional method of packaging RAM 102 and the error correction code encoding/decoding circuit 112 separately the number of packages and the number of wires and dimensions of the electronic apparatus tend to increase. In the method recently followed for forming the RAM 102 and the error correction code encoding/decoding circuit 112 on the same chip, moreover, a fault involving the whole chip is not completely detectable as even the error correction code encoding/decoding circuit 112 ceases to function.

According to this embodiment, RAM 102 with error correction code encoding/decoding circuit 112 capable of detecting a fault involving the whole chip is provided without causing the number of packages and that of wires to increase. Therefore, a small lightweight, reliable electronic apparatus can be provided.

Like other semiconductor elements, the storage element (ROM) storing the program involved is packaged on the same wiring substrate in the form of a bare chip and if it is incorporated into the same package, the electronic apparatus may be made drastically smaller and lighter. If ROM is incorporated into the package, it requires programming and erasing methods. Use of EEPROM (Electrically Erasable Programmable ROM) will make programming readily possible and make the program erasable. Even when UVEPROM (Ultra-Violet Erasable Programmable ROM) is used, the program may be executed or erased by providing the apparatus with a window which allows erasing ultra-violet rays which pass therethrough.

When EPROM is used as a space electronic apparatus to be exposed to cosmic rays, the data written by means of the cosmic ray may be erased. Moreover, EPROM is not fit for use as an electronic apparatus to be used over several hundred thousand years as the electronic thermal movement. Therefore mask-or fuse-ROMs will have to be used for the purpose described above.

For program development, the program involved has to be modified and rewritten. For this reason, a mask- or fuse-ROM may not efficiently be used for such program development. According to the following embodiment of the present invention, the electronic apparatus leads the line connected to ROM out of the package and makes it possible to operate ROM outside the package. Consequently, no wire bonding is provided for ROM in the developing package. By connecting a program externally, that is, its easily erasable EPROM to an external device, any program may be developed by means of a wiring substrate having the same pattern as that proposed in the present invention.

Figure 7:
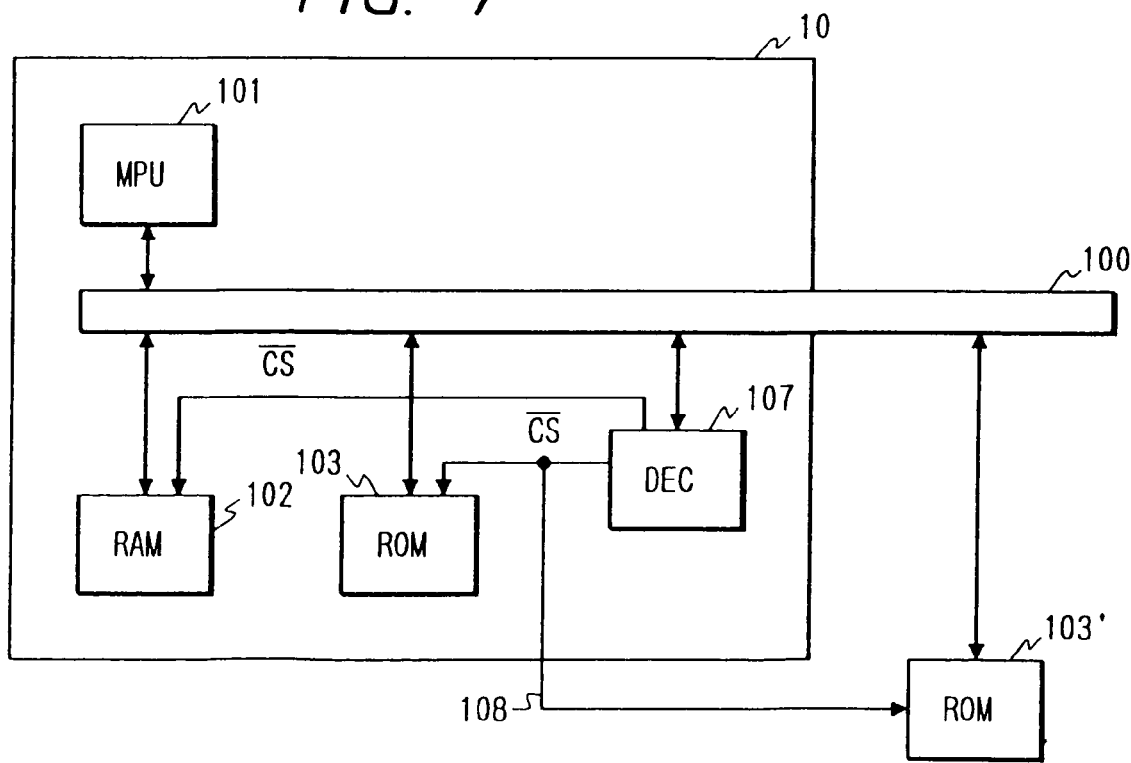
FIG. 7 is a structural view of an MPU with an external ROM on a wiring substrate in an embodiment of the present invention.

FIG. 7 refers to an embodiment wherein either ROM inside the wiring substrate 10 or an external ROM may be used to operate MPU. RAM 102 and ROM 103 are connected to MPU 101 via the bus 100 in the wiring substrate 10. Moreover, RAM 102 and ROM 103 selection signals CS# are formed by an address decoder 107. Although a signal name with a line thereon is provided for each active low signal in FIG. 7, the signal name followed by a mark is employed in this specification for convenience of description. The address decoder 107 decodes higher significant bits in an address signal supplied to the bus 100 and when the address signal indicates the address of RAM 102 or ROM 103, applies the corresponding selection signal CS# to RAM 102 or ROM 103. While the selection signal CS# is active, RAM 102 or ROM 103 reads or writes desired address data in accordance with lower significant bits.

According to this embodiment, ROM 103 selection signal CS# 108 is also sent out of the wiring substrate 10. Consequently, ROM 103' outside the wiring substrate 10 in place of ROM 103 inside the wiring substrate 10 may be used for operation. Moreover, as part of the lower significant bits in the address bus signal is sufficient for an address line to be connected to ROM 103', the number of leader lines from the wiring substrate 10 is also prevented from increasing. In order to develop a program, it is only necessary to write the program to ROM 103' outside the wiring substrate 10 without packaging ROM 103 inside the wiring substrate 10. Hence, efficient program development can be made as a program is readily written to and erased from ROM. If a mask- and a fuse-ROM are used as ROM 103 inside the wiring substrate 10 for an actual apparatus after program development, fear of risking erasure of data in ROM 103 is eliminated and an electronic apparatus stands to remain in good condition after long use.

Figure 8:
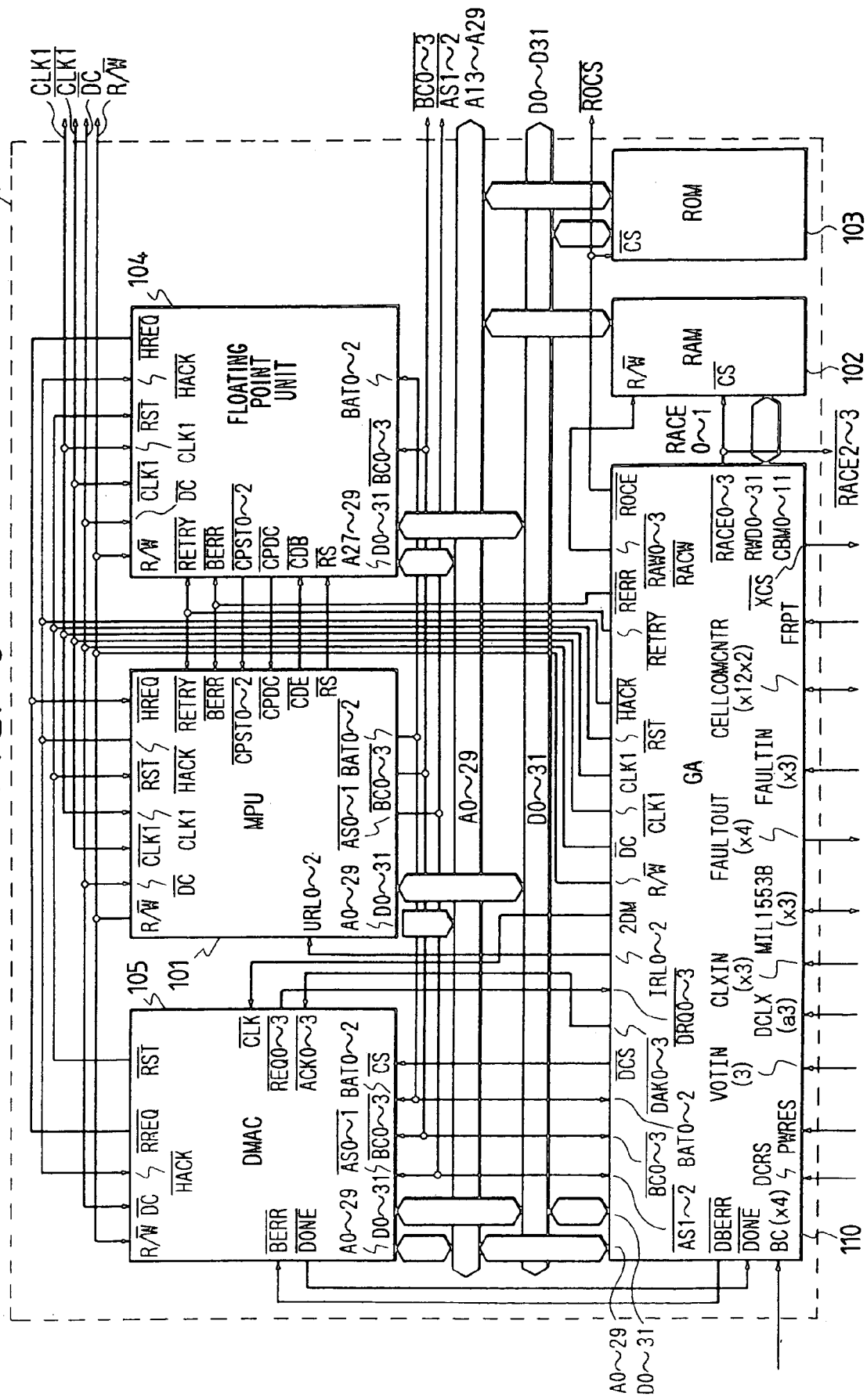
FIG. 8 is a circuit diagram of an electronic apparatus according to the present invention.

FIG. 8 is a circuit diagram embodying the present invention. MPU 101, RAM 102, ROM 103, FPU 104, DMAC 105, and a gate array 110 in the form of bare chips are mounted on the wiring substrate 10. Although RAM 102 and ROM 103 consist of a plurality of chips, depending on the memory capacity and bit width, each of them is indicated as one in FIG. 8 for simplification. The gate array 110 includes the checking circuit 111 formed with a watch dog timer and the like for detecting the operation of MPU on impulse, the error correction code encoding/decoding circuit 112 for correcting the inversion of data in RAM 102, the address decoder 107, the interface circuit 106 with external devices and the like as built-in elements. (These circuits in the gate array are not shown in FIG. 8). The number of chips can thus be reduced significantly as the peripheral circuits of MPU 101 are made into such a gate array form.

As the checking circuit 111 and the error correction code encoding/decoding circuit 112 are accommodated on the chips different from those for MPU 101, RAM 102 with respect to gate array 110, the omission of detection of a fault involving the whole chip is prevented.

Although use can be made of various kinds of respective MPU 101, FPU 104, DMAC 105, an illustration of FIG. 8 is based on the assumption that a GMICRO/200 (H32/200) series is employed. Consequently, names of various control signal lines are indicated in accordance with the specification of the GMICRO/200 (H32/200) series. Since the present invention is not implemented specifically by a particular product series, the description of signal names irrelevant to the present invention particularly will be omitted; the detailed description of them has been given in a document ('H32/200 Hardware Manual', Hitachi Ltd.). Incidentally, the bit positions of address and data lines are provided in the form of bigendian display and lower significant bits are therefore expressed by small numbers. For instance, AO of the address line represents the highest signification bit, whereas A29 represents the lowes significant bit.

The bus signal lines led out of the wire substrate 10 according to this embodiment are only as follows: address lines A13–A29, data lines DO–D31, address strobes AS1#, AS2#, byte control signals BCO#–BC2#, a read/write switching signal R/W#, and a data transfer termination signal DC#. In other words, as only of the bus signal lines is led out of the wiring substrate 10, the number of pins affixed to the outside of the package is reducible, whereby the package size can be made smaller. If it is arranged not to use ROMs outside the wiring substrate 10, all of these bus signal lines will not necessarily be led out. Thus, the number of pins is significantly reduced.

The address decoder 107 (not shown) in the gate array generates the ROM selection signal ROCS#108, a RAM selection signal RACE0#–RACE3#, an external element selection signal XCS# by means of the address lines AO–A12.

The ROM selection signal ROCS#108 on one of these signal lines is connected to ROM 103 in the wiring substrate 10 and simultaneously led out of the wiring substrate 10. According to this embodiment, ROM 103' (not shown) in place of ROM 103 inside the wiring substrate 10 may be connected to the outside of the wiring substrate 10 and used for operation. Moreover, as part of the lower signification bits A13–A29 in the address bus signal sufficient for an address line to be connected to ROM 103', the number of leader lines from the wiring substrate 10 is also prevented from increasing. In order to develop a program, it is only needed to write the program to ROM 103' outside the wiring substrate 10 without packaging ROM 103 inside the wiring substrate 10, Hence, efficient program development can be made as a program being readily written to and erased from ROM. If a mask- and a fuse-ROM is used as ROM 103 inside the wiring substrate 10 for an actual apparatus after the program development, fear of risking erasure of data in ROM 103 is eliminated and an electronic apparatus stands to remain in good condition after long use.

RACE0#–RACE1# out of the RAM selection signals RACE0#–RACE3# are connected to RAM 102 inside the wiring substrate 10, whereas RACE2#–RACE3# are led out of the wiring substrate 10. If RACE2#–RACE3# lead out of the wiring substrate 10, the byte control signal BCO#–BC2#, the read/write switching signal R/W#, the address lines A13–A29 and the data lines DO–D31 are connected to RAM 102' (not shown) outside the wiring substrate 10, an increase in storage capacity may be attained with the combination of RAM 102 and RAM 102'.

The external element selection signal XCS# leads out of the wiring substrate 10 and if the external element selection signal XCS#, the byte control signal BCO#–BC2#, the read/write switching signal R/W#, address strobes AS1#, AS2#, the data transfer termination signal DC#, the address lines A13–A29 and the data lines DO–D31 are connected to an external element (not shown), system expendability will be improved as the external element becomes usable.

The number of pins may drastically be reduced when the external element is not connected as the RAM selection signals RACE2#–RACE3#, the selection signal XCS#, the byte control signal BCO#–BC2#, the read/write switching signal R/W#, the address strobes AS1#, AS2#, the data transfer termination signal DC#, the address lines A13–A29 and the data lines D0–D31 are unnecessary to lead out of the wiring substrate 10 to RAM 102' outside the wiring substrate 10.

In addition, the gate array 110 may be allowed to incorporate the interface circuit 106 with external devices. A signal line MIL-1553B is employed for use in the so-called MIL-1553B communication standard. Moreover, a communication line CELLCOMCNTR is a communication line for coupling a plurality of computer units, each having the wiring substrate 10. If the number of wiring substrates 10 required is prepared for the communication lines CELLCOMCNTR to be connected together, it will facilitate the construction of a multiprocessor system or a multiplex computer system for fault tolerance.

Figure 9:
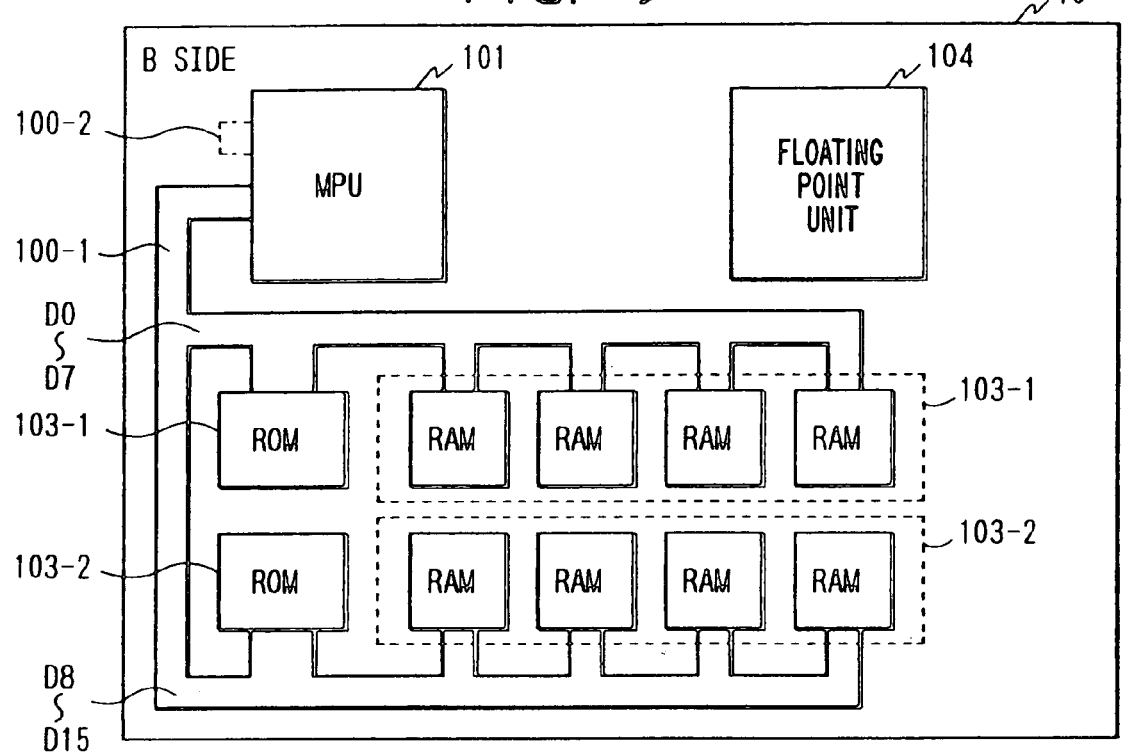
FIG. 9 is a diagram showing packaging of semiconductor chips as shown in FIG. 8 on one side of a wiring substrate.
Figure 10:
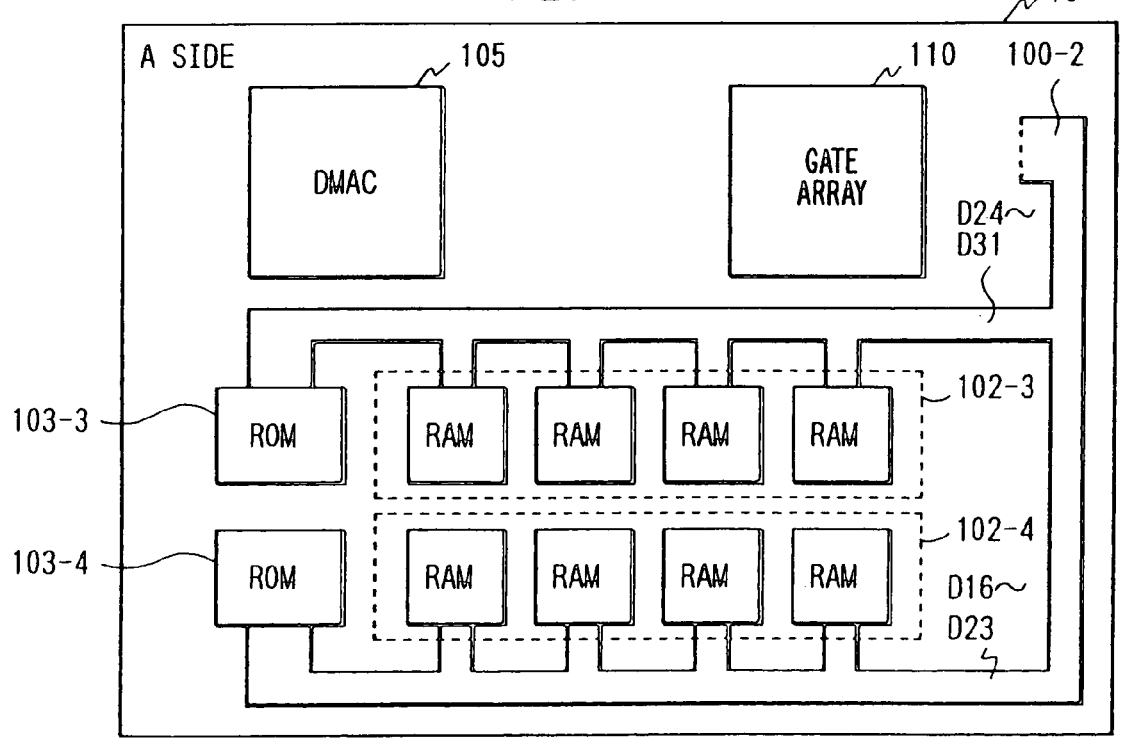
FIG. 10 is a diagram showing packaging of semiconductor chips as shown in FIG. 8 on the other side of the wiring substrate.

FIGS. 9 and 10 illustrate methods of packaging the wiring substrate 10 embodying the present invention as shown in FIG. 8.

MPU 101, FPU 104, ROMs 103-1, 103-2 and RAM 102-1, 102-2 are mounted on the surface (B side) shown in FIG. 9. The storage element, ROMs 103-1, 103-2 and RAMs 102-1, 102-2 connected to the data lines which belong to the bus 100-1 are mounted on this surface as shown in FIG. 5.

DMAC 105, the gate array 110, ROMs 103-3, 103-4 and RAMs 102-3, 102-4 are mounted on the surface (A side) shown in FIG. 10. The storage element, ROM5 103-3, 103-4 and RAMs 102-3, 102-3 connected to the data lines which belong to the bus 100-1 are mounted on this surface as shown in FIG. 5.

As the number of wiring layer-to-layer via holes as reduced according to this embodiment, the wiring substrate 10 can be made smaller. Moreover, the concentration of heat and wiring to one side is made avoidable by splitting LSI, MPU 101, FPU 104, DMAC 105 and the gate array 110 into two groups, each having a large chip size and many input-output signal lines, and allotting them to the respective sides. In view of thermal resistance, chemical stability and the like, a ceramic substrate is fit for use as the wiring substrate 10 when it is employed in space where reliability is required.

Figure 11:
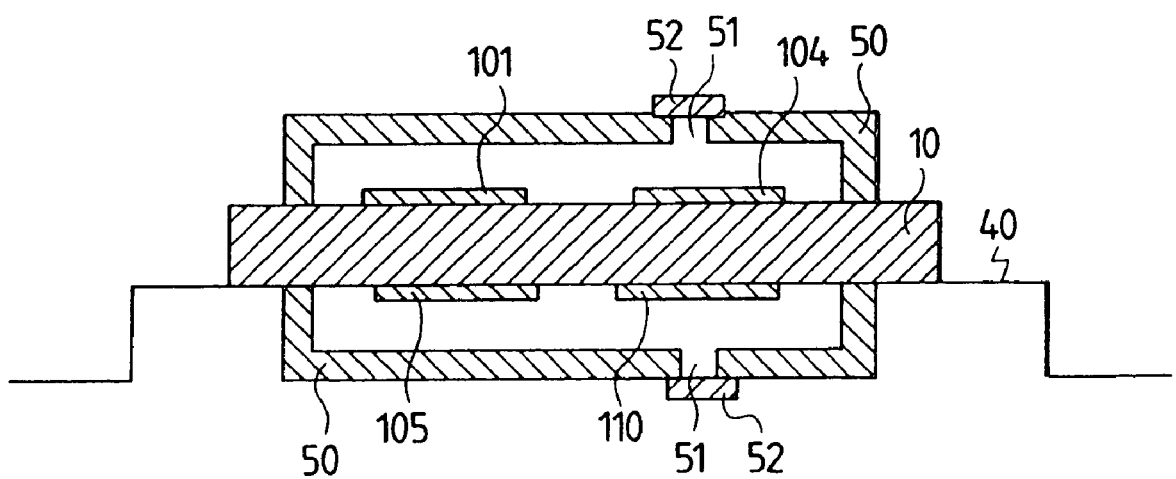
FIG. 11 is a sectional view of a package in an embodiment of the present invention.

FIG. 11 illustrates a package embodying the present invention. Ceramic caps 50 are attached to the respective sides of the ceramic wiring substrate 10 to hermetically seal bare chips such as MPU 101 mounted thereon. The inside thus hermetically sealed by the caps 50 is kept under vacuum or filled with an inactive gas of nitrogen, helium or the like. If the helium is filled up, it will conveniently be used for leakage checking when the air-tightness of the seal is checked. When it is attempted to accommodate a plurality of chips into a single package, the package tends to become large and the volume of the air inside the caps 50 also tends to increase. When the ceramic caps 50 are attached to the respective sides of the ceramic wiring substrate 10 before being used to hermetically seal the contents by soldering, the molten solder may be drawn into or jutted out of the caps 50 due to the difference is pressure between the inside and the outside as the solder cools. One of the measures to be taken to prevent the molten solder from being drawn into or jutted out of the caps 50 even though a package is large is to bore ventilating holes 51 into them and to over the holes 51 with lids 52 or the like after the contents are hermetically sealed with the inactive gas encapsulated.

According to the present invention, a plurality of semiconductor elements can be accommodated in a single package and the number of signal lines to be led out of the package is reducible, so that the package size in decreased. Therefore, a small lightweight electronic apparatus is made available.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. An electronic apparatus comprising:
a wiring substrate which includes wiring conductors; and
a plurality of semiconductor bare chips that are formed on said wiring substrate,
wherein said semiconductor bare chips include a processor for processing data and a circuit having a checking function for detecting faults of the processor, and
wherein said processor and said circuit are each formed in a bare chip.

2. An electronic apparatus according to claim 1, wherein said wiring substrate is a multilayer wiring substrate.

3. An electronic apparatus according to claim 2, wherein said multilayer wiring substrate is a ceramic substrate.

4. An electronic apparatus according to claim 1, wherein a semiconductor bare chip corresponding to said circuit are connected respectively with said wiring substrate by wire bonding.

5. An electronic apparatus according to claim 1, wherein the checking function of said circuit is a watch dog timer for resetting said processor when faults of said processor are detected.

6. An electronic apparatus according to claim 1, wherein at least one of said semiconductor bare chips is a memory for storing data.

* * * * *